US012787322B2

(12) United States Patent
Holt et al.

(10) Patent No.: US 12,787,322 B2

(45) Date of Patent: Nov. 3, 2026

(54) VERTICAL HETEROJUNCTION BIPOLAR TRANSISTOR

(71) Applicant: GlobalFoundries U.S. Inc., Malta, NY (US)

(72) Inventors: Judson R. Holt, Ballston Lake, NY (US); Crystal R. Kenney, Waterford, NY (US); Vibhor Jain, Clifton Park, NY (US); John J. Pekarik, Underhill, VT (US); Mona Nafari, Clifton Park, NY (US); Jeffrey B. Johnson, North Hero, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 437 days.

(21) Appl. No.: 18/512,859

(22) Filed: Nov. 17, 2023

(65) Prior Publication Data

US 2025/0169087 A1 May 22, 2025

(51) Int. Cl.

*H10D 10/80* (2025.01)
*H10D 10/01* (2025.01)
(Continued)

(52) U.S. Cl.

CPC ......... *H10D 10/821* (2025.01); *H10D 10/021* (2025.01); *H10D 62/138* (2025.01); *H10D 62/822* (2025.01); *H10D 62/115* (2025.01)

(58) Field of Classification Search

CPC .. H10D 62/137; H10D 62/822; H10D 10/891; H10D 10/021; H10D 62/138; H10D 10/821; H10D 62/115; H10D 10/60; H10D 10/311; H10D 10/041; H10D 62/184; H10D 10/061; H10D 62/134; H10D 62/83;

(Continued)

(56) References Cited

U.S. PATENT DOCUMENTS 5,789,301 A * 8/1998 Hill ...................... H10D 10/021 438/320
6,737,684 B1 5/2004 Takagi et al.
(Continued)

FOREIGN PATENT DOCUMENTS

KR 20030073771 A 9/2003
TW 201842668 A 12/2018

OTHER PUBLICATIONS

Chinese Office Action dated Sep. 4, 2025, in CN Application No. 113139476, 15 pages.
(Continued)

*Primary Examiner* — Mouloucoulaye Inoussa

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to vertical heterojunction bipolar transistors and methods of manufacture. The structure includes: a sub-collector region; a collector region above the sub-collector region; an intrinsic base above the collector region; an emitter above the intrinsic base region; and an extrinsic base on the intrinsic base and adjacent to the emitter, wherein the collector region includes an undercut profile comprising lower inwardly tapered sidewalls and upper inwardly tapered sidewalls which extend to a narrow section between the sub-collector region and the base region.

18 Claims, 4 Drawing Sheets

(51) Int. Cl.
*H10D 62/10* (2025.01)
*H10D 62/13* (2025.01)
*H10D 62/822* (2025.01)

(58) Field of Classification Search
CPC .... H10D 10/80; H10D 84/401; H10D 62/177; H10D 10/441; H10D 62/116; H10D 10/40; H10D 10/051; H10D 10/054
See application file for complete search history.

(56) References Cited

U.S. PATENT DOCUMENTS

| | | | | |
|---|---|---|---|---|
| 7,144,787 | B2 | 12/2006 | Dokumaci et al. | |
| 8,476,675 | B2 | 7/2013 | Meunier-Beillard et al. | |
| 9,029,229 | B2 | 5/2015 | Adkisson et al. | |
| 9,059,233 | B2 | 6/2015 | Leidy et al. | |
| 9,093,491 | B2 | 7/2015 | Adkisson et al. | |
| 9,159,817 | B2 | 10/2015 | Camillo-Castillo et al. | |
| 9,240,448 | B2 | 1/2016 | Adkisson et al. | |
| 9,318,551 | B2 | 4/2016 | Camillo-Castillo et al. | |
| 9,324,846 | B1 * | 4/2016 | Camillo-Castillo | H10D 10/821 |
| 9,337,323 | B2 | 5/2016 | Dunn et al. | |
| 9,349,845 | B2 | 5/2016 | Harame et al. | |
| 9,368,608 | B1 | 6/2016 | Camillo-Castillo et al. | |
| 9,461,139 | B1 | 10/2016 | Liu | |
| 9,570,564 | B2 | 2/2017 | Alperstein et al. | |
| 10,090,287 | B1 * | 10/2018 | Adusumilli | H10D 1/047 |
| 10,115,810 | B2 | 10/2018 | Liu et al. | |
| 10,170,553 | B2 | 1/2019 | Camillo-Castillo et al. | |
| 10,672,872 | B1 | 6/2020 | Lee et al. | |
| 10,825,921 | B2 | 11/2020 | Balakrishnan et al. | |
| 11,362,201 | B1 * | 6/2022 | McTaggart | H10D 10/891 |
| 2003/0077870 | A1 * | 4/2003 | Yoon | H10D 10/021 438/320 |
| 2010/0003800 | A1 * | 1/2010 | Pagette | H10D 10/021 257/E21.372 |
| 2014/0327111 | A1 * | 11/2014 | Camillo-Castillo | H10D 62/115 257/586 |
| 2015/0060950 | A1 * | 3/2015 | Camillo-Castillo | H10D 62/115 257/586 |
| 2015/0206959 | A1 | 7/2015 | Benoit et al. | |
| 2016/0190292 | A1 | 6/2016 | Adkisson et al. | |
| 2018/0240898 | A1 * | 8/2018 | Tao | H10D 62/135 |
| 2018/0286968 | A1 * | 10/2018 | Jain | H10D 10/40 |
| 2019/0172933 | A1 * | 6/2019 | Obu | H10D 10/821 |
| 2020/0066876 | A1 | 2/2020 | Hashemi et al. | |
| 2021/0091213 | A1 * | 3/2021 | Jain | H10D 10/021 |
| 2021/0257454 | A1 * | 8/2021 | Adusumilli | H10D 10/821 |
| 2022/0216303 | A1 * | 7/2022 | Yu | H10D 64/231 |
| 2022/0238646 | A1 * | 7/2022 | Levy | H10D 62/117 |
| 2023/0083044 | A1 * | 3/2023 | Derrickson | H10D 10/60 257/586 |
| 2023/0215937 | A1 * | 7/2023 | Donkers | H10D 62/83 257/197 |
| 2025/0261387 | A1 * | 8/2025 | Cheng | H10D 10/891 |

OTHER PUBLICATIONS

Y. Ishii et al., "Anisotropic selective etching between SiGe and Si", Japanese Journal of Applied Physics, vol. 57, No. 6S2, 2018, 5 pages. DOI: 10.7567/JJAP.57.06JC04.

C. F. Ahles et al., "Selective etching of silicon in preference to germanium and Si0. 5Ge0. 5.", ACS Applied Materials & Interfaces 9.24, 2017, pp. 20947-20954, 8 pages.

International Office Action dated Jun. 10, 2025 in KR Application No. 10-2024-0141947, 14 pages.

European Search Report and Opinion dated Nov. 22, 2024 in EP Application No. 24181005.0-1211, 11 pages.

European Office Action dated Jan. 2, 2026 in EP Application No. 24181005.0-12111, 8 Pages.

Rucker et al., "High-performance SiGe HBTs for next generation BiCMOS technology," https://doi.org/ 10.1088/ 1361-6641 / aade64, Open Access IOP Publishing, Semiconductor Science and Technology 33 (2018) 114003 6 Pages.

Taiwanese Office Action dated Jan. 13, 2026 in TW Application No. 113139476 with Google Machine Translation, 20 pages.

* cited by examiner

VERTICAL HETEROJUNCTION BIPOLAR TRANSISTOR

This invention was made with government support under Contract #HR0011-203-0002 awarded by DARPA-T-MUSIC. The government has certain rights in the invention.

BACKGROUND

The present disclosure relates to semiconductor structures and, more particularly, to vertical heterojunction bipolar transistors and methods of manufacture.

A heterojunction bipolar transistor is a type of bipolar junction transistor which uses differing semiconductor materials for the emitter and base regions, creating a heterojunction. The heterojunction bipolar transistor can handle signals of very high frequencies, up to several hundred GHz. The heterojunction bipolar transistor may be used in modern ultrafast circuits including radio frequency (RF) systems, and in applications requiring a high power efficiency, such as RF power amplifiers in cellular telephones.

SUMMARY

In an aspect of the disclosure, a structure comprises: a sub-collector region; a collector region above the sub-collector region; an intrinsic base above the collector region; an emitter above the intrinsic base region; and an extrinsic base on the intrinsic base and adjacent to the emitter, wherein the collector region includes an undercut profile comprising lower inwardly tapered sidewalls and upper inwardly tapered sidewalls which extend to a narrow section between the sub-collector region and the base region.

In an aspect of the disclosure, a structure comprises: a sub-collector region comprising a first semiconductor material; an intrinsic base; an emitter; an extrinsic base on the intrinsic base and adjacent to the emitter; and a collector comprising an undercut profile comprising lower inwardly tapered sidewalls and upper inwardly tapered sidewalls which extending to a narrow section between the sub-collector region and the intrinsic base.

In an aspect of the disclosure, a method comprises: forming a sub-collector region; forming a collector above the sub-collector region; forming an intrinsic base above the collector region; forming an emitter above the intrinsic base region; forming an extrinsic base on the intrinsic base and adjacent to the emitter; and forming an undercut in the collector region, the undercut comprising lower inwardly tapered sidewalls and upper inwardly tapered sidewalls which extending to a narrow section between the sub-collector region and the extrinsic base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical heterojunction bipolar transistors and methods of manufacture. More specifically, the present disclosure is directed to a vertical heterojunction bipolar transistor with a sidewall undercut (e.g., undercut profile) and methods of manufacture. Advantageously, the present disclosure provides the ability to control and modify a recess structure to achieve a high performance device.

In embodiments, the high performance device described herein may be a vertical heterojunction bipolar transistor with different collector profiles. The vertical heterojunction bipolar transistor may include, for example, an N+ Si/SiGe sub-collector, an n-type Si collector, a p-SiGe base and an n+ Si emitter; although other materials are contemplated herein. For example, although the high performance device is described with respect to an NPN transistor structure, it should be understood by those of skill in the art that the high performance device can equally be a PNP transistor structure by reversing the doping scheme. An undercut profile may be provided in the collector between the base and sub-collector. A lateral width of the collector is less than sub-collector and base.

The vertical heterojunction bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical heterojunction bipolar transistor of the present disclosure have been adopted from integrated circuit (IC) technology. For example, the structures are built on wafers and are realized in films of material patterned by photolithographic processes on the top of a wafer. In particular, the fabrication of the vertical heterojunction bipolar transistors uses three basic building blocks: (i) deposition or growth of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
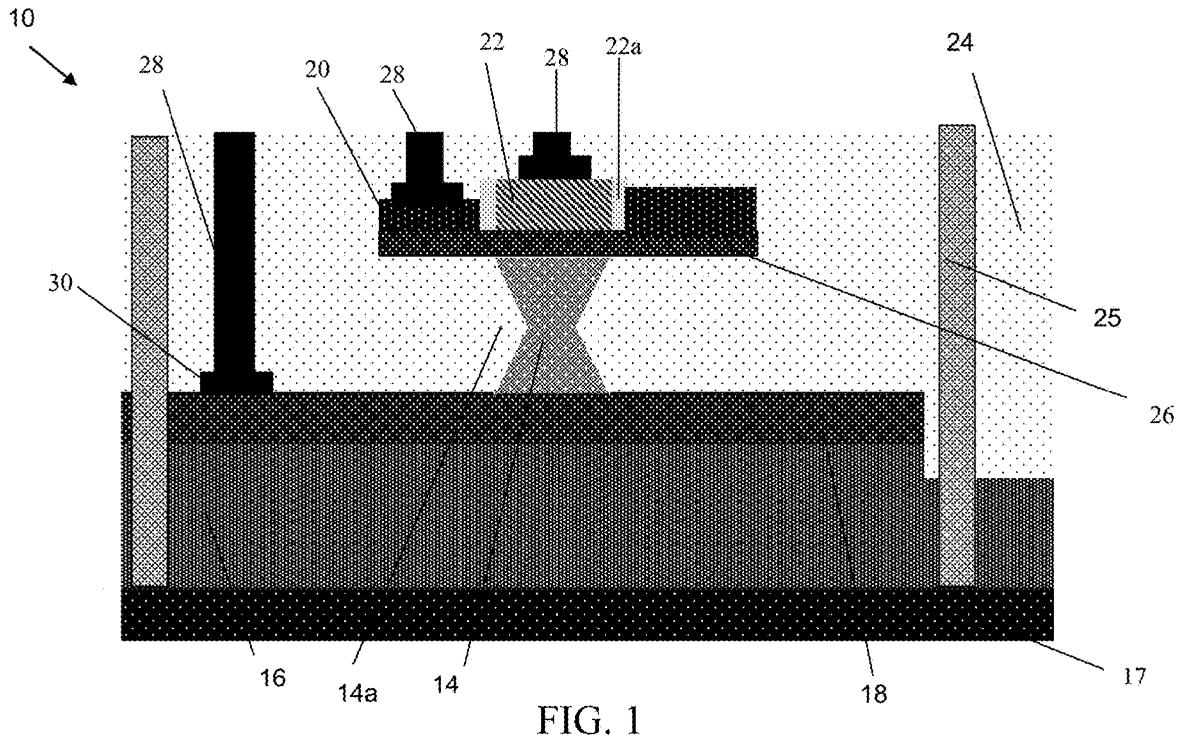
FIG. 1 shows a structure and respective fabrication processes in accordance with aspects of the present disclosure.

FIG. 1 shows a structure and respective fabrication processes in accordance with aspects of the present disclosure. In particular, the structure 10 of FIG. 1 shows a collector 14 with an undercut region (e.g., profile) **14*a*. The collector 14 may be provided between a sub-collector 16, 18, an extrinsic base 20 and an emitter 22. The undercut region 14*a* may be filled with interlevel dielectric material 24 formed by conventional deposition processes, e.g., chemical vapor deposition (CVD). An optional deep trench isolation structure 25** may be provided to isolate the device.

More specifically, in the structure 10 of FIG. 1, the sub-collector 16, 18 may comprise preferably Si material and, more preferably N+ doped Si material. For example, the sub-collector 16 may be doped with phosphorus (e.g., SiP). The sub-collector 16 may also be single crystalline semiconductor material with a suitable crystallographic orientation (e.g., a (100), (110), (111), or (001) crystallographic orientation). As should be understood by those of skill in the art, the sub-collector 16 may be formed on a p-type substrate 17 as is known in the art such that no further explanation is required for a complete understanding of the present invention.

The semiconductor material 18 may be another type of semiconductor material, e.g., SiGe. In preferred embodiments, the semiconductor material 18 may be N+ SiGe material epitaxially grown on the sub-collector 16. For example, the SiGe material may be in-situ doped with phosphorous (SiGeP), as an example. Alternatively, the SiGe material may be implanted or may be doped by out-diffusion from the surrounding regions. In embodiments, the sub-collector 16 may comprise both N-type Si as well as N-type SiGe. That is, it is possible that the entire sub-collector region could be SiGe, or it could be just a thin layer of SiGe with N-type Si above and below. It should also be recognized as described herein that the at least one layer of N-type SiGe, which may be in the collector or sub-collector region, will serve as an etch stop for the undercut recess, e.g., undercut profile 14*a* as described herein.

The collector 14 may be a same material as the semiconductor substrate 16. For example, the collector 14 may be n-doped Si material. In embodiments, the lateral width of the collector 14 is less than a length (or width depending on the perspective view) of the sub-collector material 18 and the intrinsic base 26 or the extrinsic base 20, and the undercut profile 14*a* is between the sub-collector 18 and the intrinsic base 26 or the extrinsic base 20.

The undercut profile (e.g., region) 14*a* of the collector 14 may comprise an narrowed or undercut region, e.g., narrowed profile portion, which is filled with and surrounded by interlevel dielectric material 24. The interlevel dielectric material 24 may also be over the semiconductor substrate 16, 18 and surrounding the collector 14, intrinsic base 26, extrinsic base 20 and emitter 22. In embodiments, the interlevel dielectric material 24 may be oxide, nitride or combinations thereof.

In this embodiment, the undercut region 14*a* may comprise a narrow middle portion and wider upper and lower portions. In more specific embodiments, the undercut region 14*a* may include an inwardly tapered sidewall profile from the top to middle portion and from the bottom to the middle portion, resulting in a middle portion having a narrowest cross section along a vertical axis; although other configurations are contemplated herein as further described with respect to the different embodiments shown in FIGS. 4A-4F. The undercut region 14*a* may be formed by a wet or dry etch with a selective chemistry to etch the material of the collector 14. It should be understood by those of skill in the art that the term "taper" can apply to both sharply faceted and rounded recess shapes or combinations thereof.

Still referring to FIG. 1, the intrinsic base 26 may for formed over the collector 14. In embodiments, the intrinsic base 26 may be a p-doped semiconductor material. In more specific embodiments, the intrinsic base 26 may be SiGe. For example, the intrinsic base 26 may be epitaxially grown from the collector 14 with an in-situ p-type dopant, followed by a conventional patterning process, e.g., lithography and etching (reactive ion etching (RIE) processes). In preferred embodiments, the p-type dopant comprises Boron resulting in SiGeB. The intrinsic base 26 should be different material than the collector 14 so as to be able to provide the undercut through a selective etching process.

The extrinsic base 20 may be formed over the intrinsic base 26, surrounding or on sides of the emitter 22. The emitter 22 may be formed on the intrinsic base 26 and may be isolated from the extrinsic base 20 by sidewall spacers 22*a*. The sidewall spacers 22*a* may be a nitride and/or oxide material formed by a conventional deposition process, e.g., CVD, followed by an anisotropic etching process. The emitter 22 may comprise an n-doped semiconductor material. For example, the dopant may be phosphorous (resulting in SiP) or arsenic (resulting in SiAs). The emitter 22 may be formed by conventional epitaxial growth processes with an in-situ doping process as is known in the art. In embodiments, the emitter 22 may be formed after the extrinsic base 20. For example, the material for the emitter 22 may be deposited in a trench etched through the extrinsic base 20 as is known in the art.

Following the formation of the emitter 22, the extrinsic base 20 may be formed adjacent sides of the sidewall spacers 22*a*. In embodiments, the extrinsic base 20 may be formed by conventional epitaxial growth processes with an in-situ doping process as is known in the art. The extrinsic base 20 may be epitaxially grown on the collector 14, with a p-type dopant. In preferred embodiments, the p-type dopant comprises Boron resulting in SiB or SiGeB, as examples. Other examples of suitable semiconductor materials used for the collector 14, sub-collector 16, 18, emitter 22 and bases 20, 26 may be SiGeC, SiC, GE alloys, GaAs, InAs, InP, and other III/V or II/VI compound semiconductors, noting a selectivity should still be present with respect to the collector 14.

FIG. 1 further shows contacts 28, e.g., wiring structures or interconnect structures, and silicide contacts 30. The contacts 28 and silicide contacts 30 may be directly in contact with the sub-collector 18, the emitter 22 and the extrinsic base 20. In embodiments, the contacts 28 may be formed through the interlevel dielectric material 24 by conventional lithography, etching and deposition methods known to those of skill in the art.

For example, a resist formed over the interlevel dielectric material 24 is exposed to energy (light) and developed utilizing a conventional resist developer to form a pattern (opening). An etching process with a selective chemistry, e.g., reactive ion etching (RIE), will be used to transfer the pattern from the photoresist layer to the interlevel dielectric material 24 to form one or more trenches in the interlevel dielectric material 24 through the openings of the resist. Following the resist removal by a conventional oxygen ashing process or other known stripants, conductive material, e.g., W, Al, Cu with a TiN or TaN liner, for example, can be deposited by any conventional deposition processes, e.g., CVD processes. Any residual material on the surface of the insulator interlevel dielectric material 24 can be removed by conventional chemical mechanical polishing (CMP) processes.

Also, as should be understood by those of skill in the art, the silicide process begins with deposition of a thin transition metal layer, e.g., nickel, cobalt or titanium, over fully formed and patterned semiconductor devices (e.g., sub-collector 16, the emitter 22 and the extrinsic base 20). After deposition of the material, the structure is heated allowing the transition metal to react with exposed silicon (or other semiconductor material as described herein) in the active regions of the semiconductor device (e.g., sub-collector 16, the emitter 22 and the extrinsic base 20) forming a low-resistance transition metal silicide. Following the reaction, any remaining transition metal is removed by chemical etching, leaving silicide contacts 30 in the active regions of the device.

Figure 2:
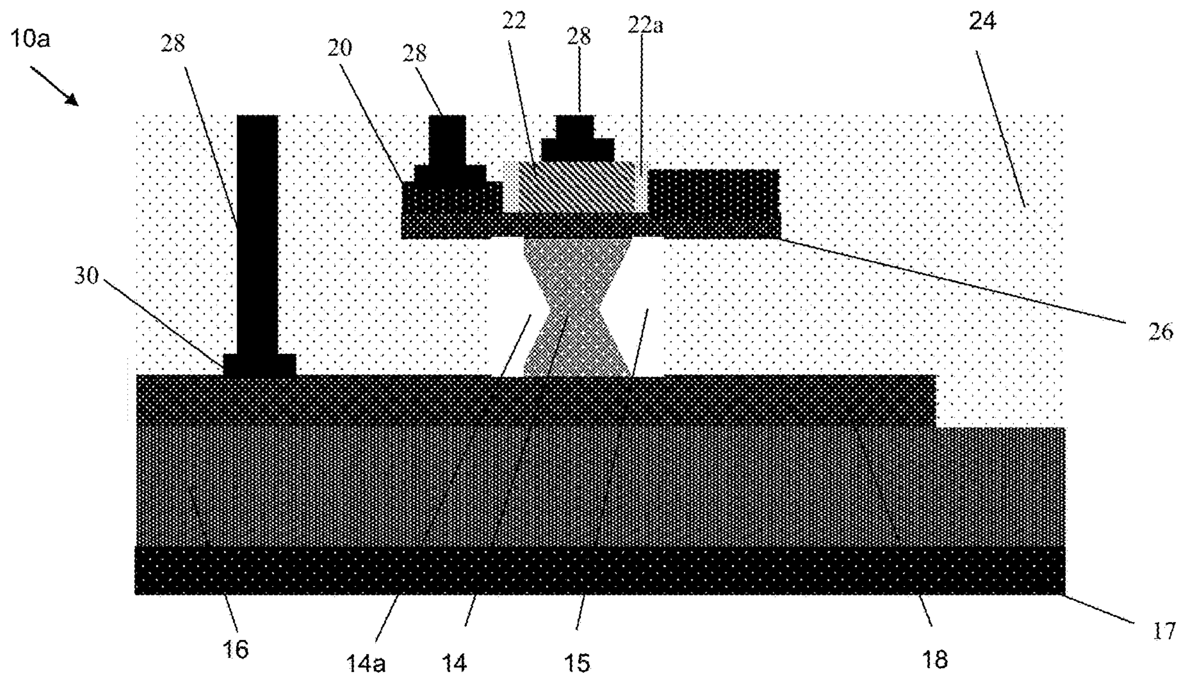
FIG. 2 shows a structure and respective fabrication processes in accordance with additional aspects of the present disclosure.

FIG. 2 shows another structure 10*a* in accordance with additional aspects of the present disclosure. In the structure 10*a* of FIG. 2, the collector 14 includes the undercut region 14*a* surrounded by an airgap 15 formed in the interlevel dielectric material 24. The airgap 15 preferably extends to the sidewalls of the collector 14. In embodiments, the airgap 15 may be formed by a conventional pinch-off process, which is formed during the deposition of the interlevel dielectric material 24 as is known in the art. The remaining features of the structure 10*a* are similar to the structure 10 of FIG. 1 such that no further explanation is required for a complete understanding of the present disclosure.

Figure 3:
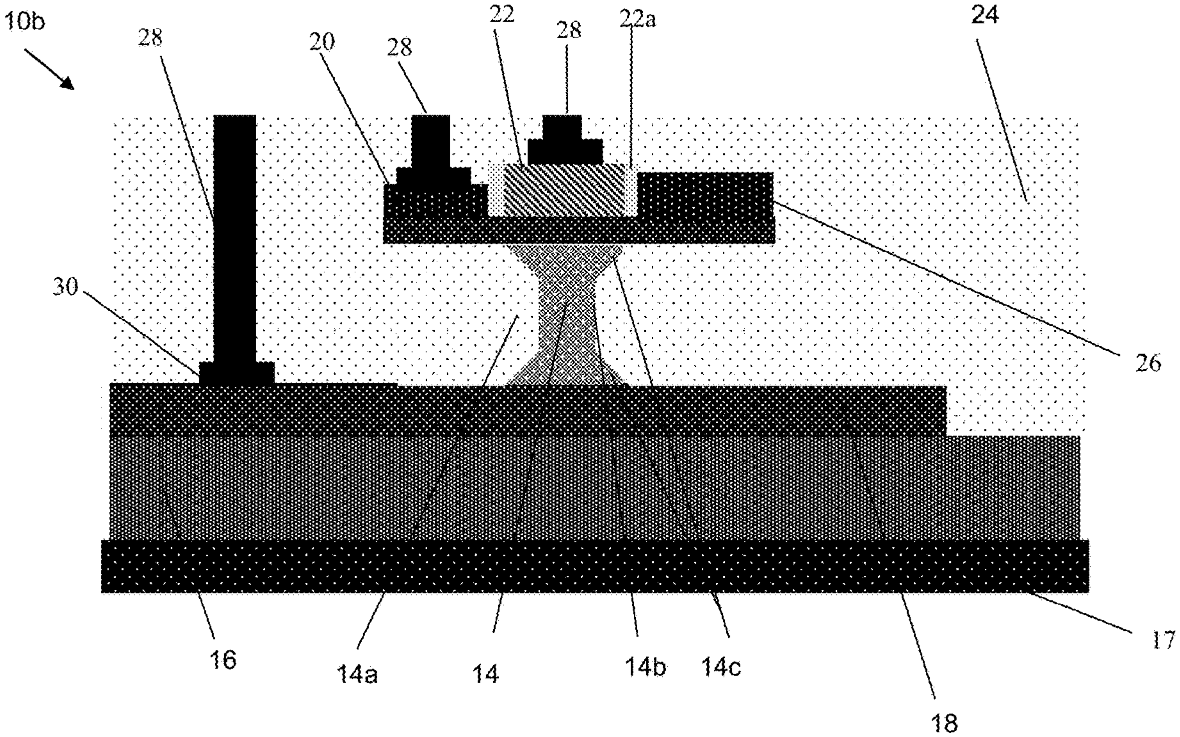
FIG. 3 shows a structure and respective fabrication processes in accordance with further aspects of the present disclosure.

FIG. 3 shows another structure 10*b* in accordance with additional aspects of the present disclosure. In the structure 10*b* of FIG. 3, the undercut region 14*a* includes a straight portion 14*b* and a tapered portion 14*c*. The tapered portion 14*c* comprises an inwardly tapered profile from the top to the straight section 14*b* (at an approximate mid portion) and from the bottom to the to the straight section 14*b* (at an approximate mid portion). It should be understood by one skilled in the art that the recessed profile may include embodiments that are rounded and/or asymmetric. In this and other embodiments described herein, the collector 14 and undercut region 14*a* may be surrounded by the interlevel dielectric material 24 or an airgap formed in the interlevel dielectric material 24. The remaining features of the structure 10*b* are similar to the structure 10 of FIG. 1 such that no further explanation is required for a complete understanding of the present disclosure.

Figure 4A:
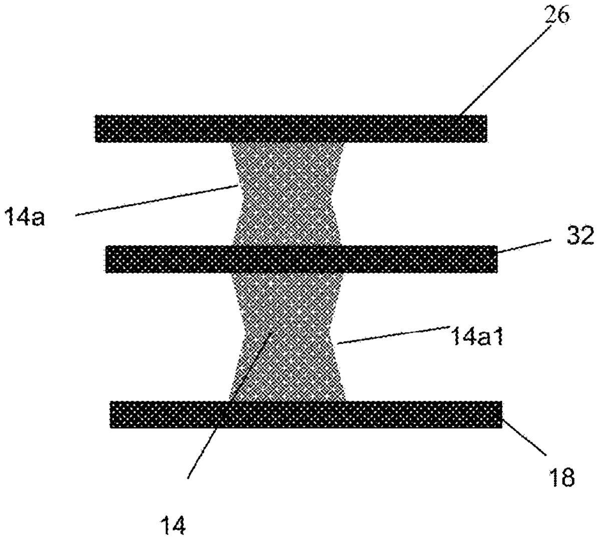
FIGS. 4A-4F show various collector profiles in accordance with aspects of the present disclosure.

FIGS. 4A-4F show various profiles of collectors in accordance with aspects of the present disclosure. For example, FIG. 4A shows a collector 14 with two recessed portions 14*a*, 14*al* separated along the vertical axis by a layer of semiconductor material 32. In embodiments, the layer of semiconductor material 32 will extend through a wider portion of the collector 14. Also, in embodiments, each of the recessed portions 14*a*, 14*al* include inwardly tapered sidewalls as already described herein.

The layer of semiconductor material 32, as with each of the undercut profiles described with respect to FIGS. 4A-4F, may be semiconductor material that etches selectively with respect to the semiconductor material of the collector 14. In embodiments, the layer of semiconductor material 32 may be the same material as the semiconductor material used for the sub-collector 18 and the extrinsic base 28. For example, the layer of semiconductor material 32 may be SiGe; whereas the collector 14 may be Si. Also, it should be understood by those of skill in the art that by including one or more SiGe layers with a lower or higher percentage Ge material, by varying the spacing of the layer 32, percentage of Ge, or thickness, the undercut profile can be precisely tuned to achieve any desired shape. For example, in the embodiment of FIG. 4A, a higher percentage of Ge can be used to provide the desired profile.

Figure 4B:
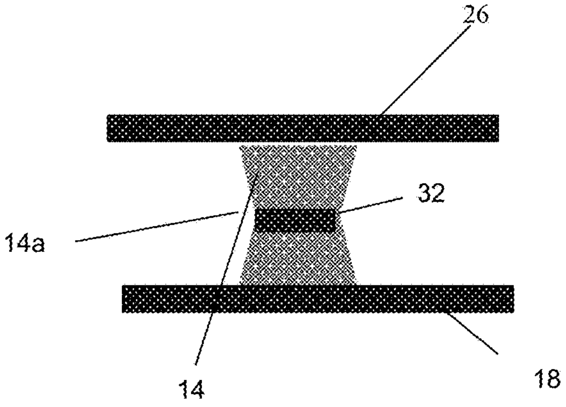

FIG. 4B shows a collector 14 with a recessed portion 14*a* comprising inwardly tapered sidewalls, as noted in the structures 10, 10*a*, 10*b*. In this embodiment, though, a layer of semiconductor material 32 may extend through the narrow region of the collector 14, approximately at the center along the vertical axis. Also, as should now be understood, the undercut profile 14*a* shown in the embodiment of FIG. 4B can be precisely tuned by providing a lower percentage of Ge in order to obtain the desired shape. In this way, to obtain a wider region of the undercut profile would use a higher percentage of Ge, compared to a lower percentage of Ge for a narrower section of the undercut profile.

Figure 4C:
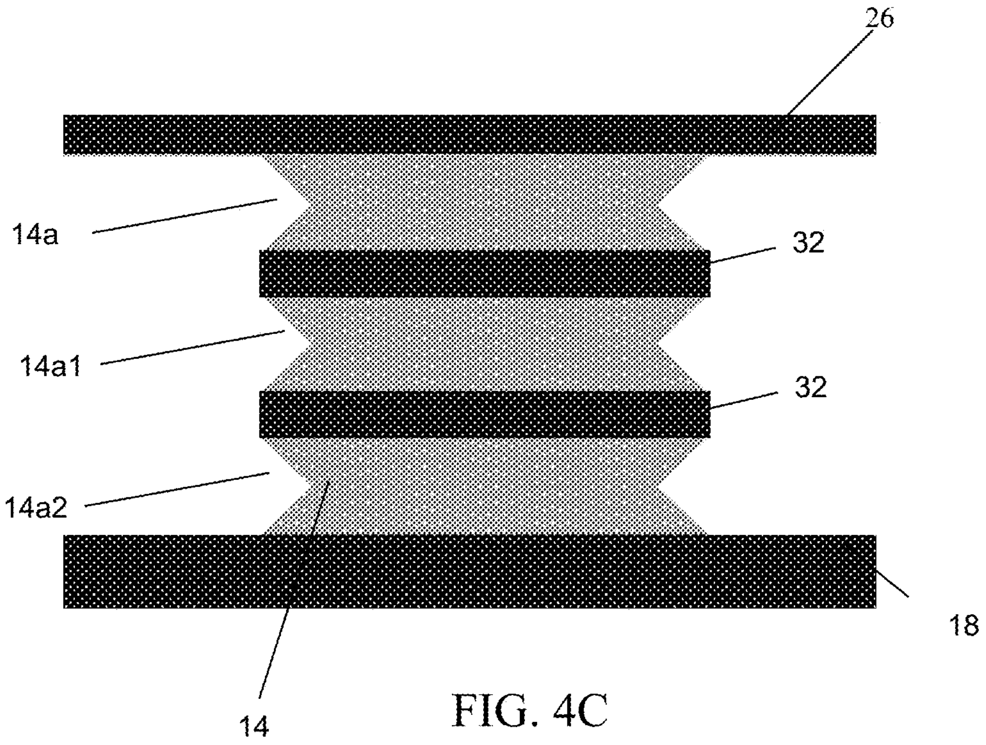
Figure 4D:
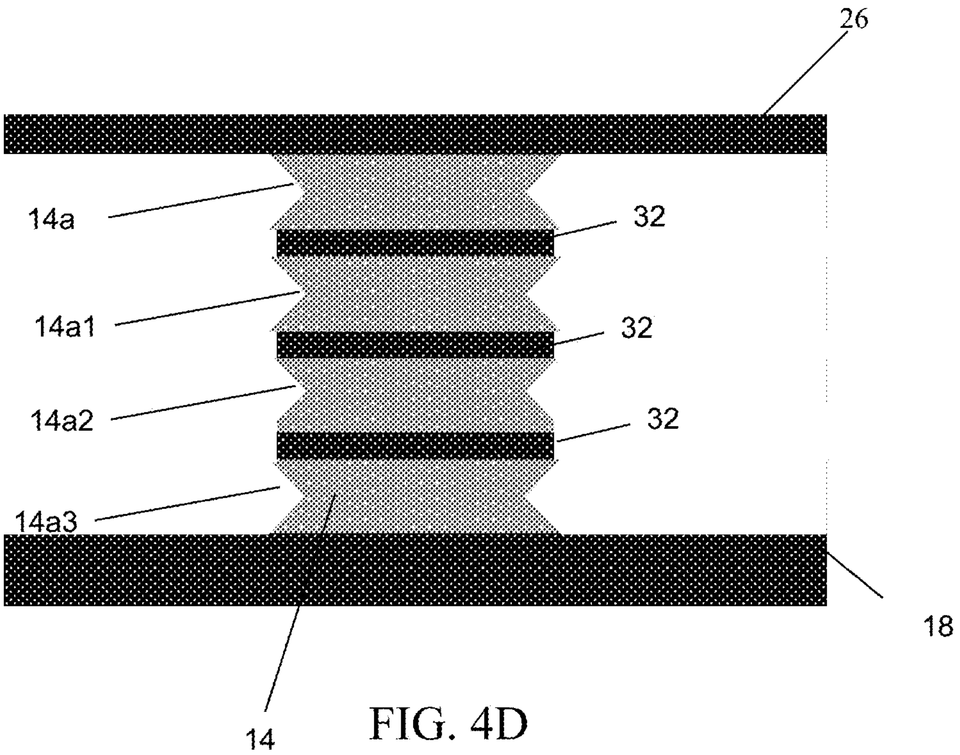

FIGS. 4C and 4D show collectors 14 with multiple recessed portions separated along the vertical axis by one or more layers of semiconductor material 32. For example, in FIG. 4C, the collector 14 includes three recessed portions 14*a*, 14*a*1, 14*a*2, each of which are separated from one another in the vertical axis by a layer of semiconductor material 32. In FIG. 4D, the collector 14 includes four recessed portions 14*a*, 14*a*1, 14*a*2, 14*a*3, each of which are separated from one another in the vertical axis by a layer of semiconductor material 32. It should be understood by those of skill in the art that more recessed portions (and respective layers of semiconductor material 32), or layers of different thicknesses, spacing, and/or composition are also contemplated by the present disclosure.

Figure 4E:
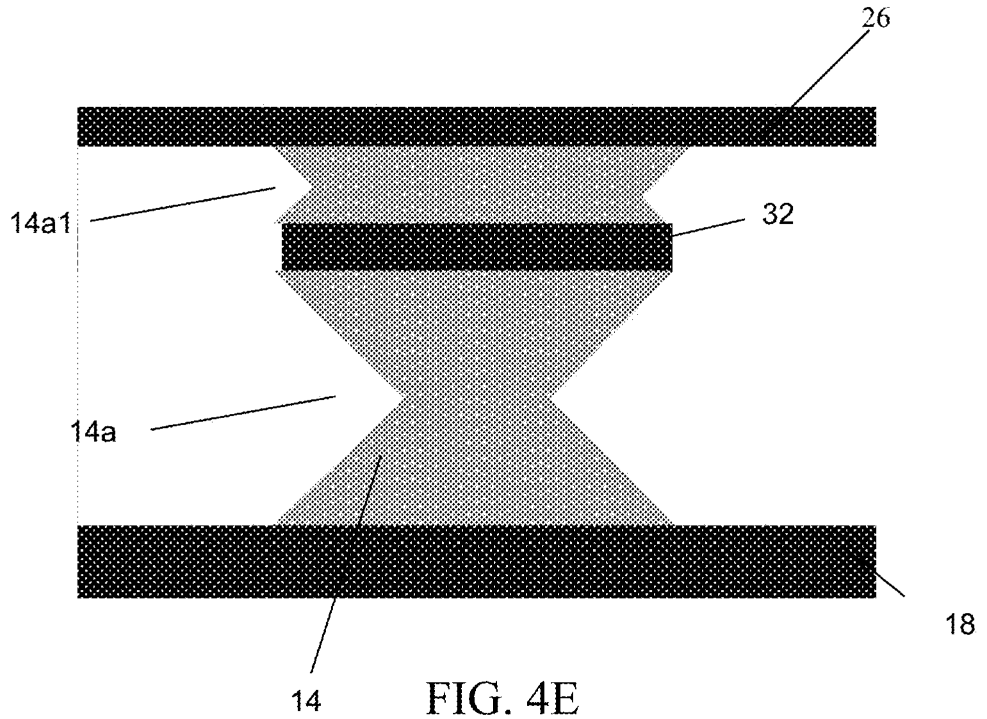
Figure 4F:
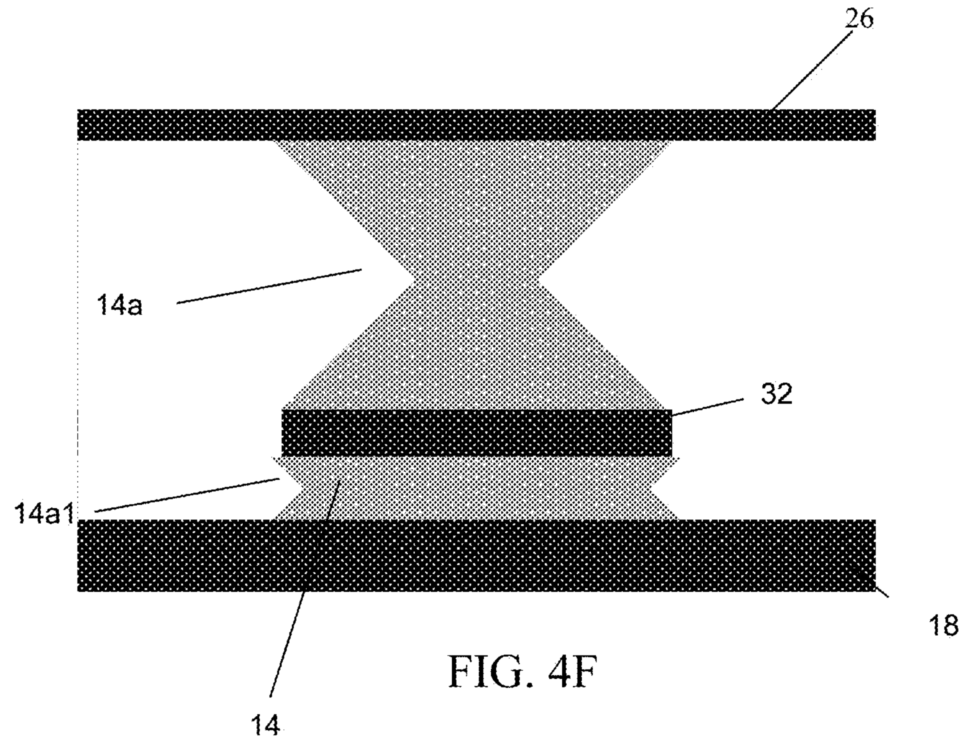

FIGS. 4E and 4F show collectors 14 with multiple recessed portions asymmetrically positioned in the vertical axis, separated in the vertical direction by a layer of semiconductor material 32. For example, in both FIGS. 4E and 4F, the undercut region 14*a* is smaller than the undercut region 14*a*1. In FIG. 4E, the undercut region 14*al* is closer to the extrinsic base 26 and, in FIG. 4F, the undercut region 14*al* is closer to the sub-collector 18. The spacings and positions of the undercut regions 14*a*, 14*al* along the vertical axis can be tuned by adjusting the location of the layer of semiconductor material 32 within the collector 14.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a sub-collector region;

a collector region above the sub-collector region;

an intrinsic base above the collector region;

an emitter above the intrinsic base; and an extrinsic base on the intrinsic base and adjacent to the emitter, wherein the collector region includes an undercut profile comprising lower inwardly tapered sidewalls and upper inwardly tapered sidewalls which extend to a narrow section between the sub-collector region and the extrinsic base, wherein the undercut profile comprises multiple recessed portions.

2. The structure of claim 1, wherein the sub-collector region and the intrinsic base comprise a semiconductor material which is different than a semiconductor material of the collector.

3. The structure of claim 2, wherein the semiconductor material of the sub-collector comprises at least n-type SiGe, the intrinsic base comprises p-type SiGe and the collector comprises n-type Si.

4. The structure of claim 1, wherein the undercut profile comprises lower inwardly tapered sidewalls and upper inwardly tapered sidewalls which extending to a narrow section between the sub-collector region and the extrinsic base.

5. The structure of claim 4, wherein the narrow section comprises a straight sidewall profile.

6. The structure of claim 4, further comprising a layer of semiconductor material extending through the narrow region of the collector, which is different than a semiconductor material of the collector region.

7. The structure of claim of claim 1, wherein the undercut profile comprises two recessed portions separated along a vertical axis by a layer of semiconductor material that is different than a semiconductor material of the collector.

8. The structure of claim 7, wherein the layer of semiconductor material extends through a wider portion of the undercut profile of the collector.

9. The structure of claim 7, wherein the layer of semiconductor material is a same semiconductor material as the sub-collector.

10. The structure of claim 1, wherein each of the multiple recessed portions are separated along a vertical axis by a semiconductor material that is different than a semiconductor material of the collector.

11. The structure of claim 1, wherein each of the multiple recessed portions are asymmetrically positioned along the vertical axis.

12. The structure of claim 4, further comprising an airgap extending to the upper and lower inwardly tapered sidewalls, and further surrounding the undercut profile.

13. A structure comprising:

a sub-collector region comprising a first semiconductor material;

an intrinsic base;

an emitter;

an extrinsic base on the intrinsic base and adjacent to the emitter; and a collector comprising an undercut profile comprising lower inwardly tapered sidewalls and upper inwardly tapered sidewalls which extending to a narrow section between the sub-collector region and the intrinsic base, wherein the undercut profile comprises multiple recessed portions each of which are separated along a vertical axis by a layer of semiconductor material that is different than a semiconductor material of the collector.

14. The structure of claim 13, wherein the first semiconductor material comprises SiGe, the intrinsic base comprise p-type doped SiGe and the sub-collector region comprises n-type doped SiGe and the semiconductor material of the collector comprises Si.

15. The structure of claim 13, wherein the narrow section comprises a straight sidewall profile.

16. The structure of claim 13, further comprising an airgap surrounding the undercut profile.

17. The structure of claim 13, wherein the sub-collector region comprising both Si material and SiGe material, with the SiGe material being an etch stop layer.

18. A method comprising:

forming a sub-collector region;

forming a collector above the sub-collector region;

forming an intrinsic base above the collector region;

forming an emitter above the intrinsic base;

forming an extrinsic base on the intrinsic base and adjacent to the emitter; and forming an undercut in the collector region, the undercut comprising lower inwardly tapered sidewalls and upper inwardly tapered sidewalls which extending to a narrow section between the sub-collector region and the extrinsic base, wherein the undercut profile comprises multiple recessed portions.

* * * * *